United States Patent
Lim

(10) Patent No.: US 10,396,750 B2
(45) Date of Patent: Aug. 27, 2019

(54) RADIO FREQUENCY TRANSMITTER HAVING IMPROVED RECEIVE BAND REJECTION FUNCTION

(71) Applicant: SAMSUNG ELECTRO-MECHANICS CO., LTD., Suwon-si (KR)

(72) Inventor: Taeho Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 41 days.

(21) Appl. No.: 15/650,184

(22) Filed: Jul. 14, 2017

(65) Prior Publication Data

US 2018/0062606 A1    Mar. 1, 2018

(30) Foreign Application Priority Data

Aug. 26, 2016  (KR) .................. 10-2016-0109333
Apr. 17, 2017  (KR) .................. 10-2017-0049109

(51) Int. Cl.
| | |
|---|---|
| H03H 7/40 | (2006.01) |
| H04B 1/04 | (2006.01) |
| H04B 1/525 | (2015.01) |
| H03H 9/25 | (2006.01) |
| H03H 19/00 | (2006.01) |
| H03H 7/01 | (2006.01) |

(52) U.S. Cl.
CPC ............ *H03H 7/40* (2013.01); *H04B 1/0458* (2013.01); *H04B 1/0475* (2013.01); *H04B 1/525* (2013.01); *H03H 9/25* (2013.01); *H03H 19/004* (2013.01); *H03H 2007/013* (2013.01)

(58) Field of Classification Search
CPC .......... H03H 7/40; H03H 9/25; H03H 19/004; H03H 2007/013

USPC .......................................................... 333/133
See application file for complete search history.

(56) References Cited

U.S. PATENT DOCUMENTS

| | | | |
|---|---|---|---|
| 6,489,862 B1 | 12/2002 | Frank | |
| 8,682,260 B1 * | 3/2014 | Granger-Jones | H04B 1/0475 455/339 |
| 2002/0197971 A1 | 12/2002 | Cho | |

FOREIGN PATENT DOCUMENTS

| | | |
|---|---|---|
| GB | 2503961 A | 1/2014 |
| KR | 10-2002-0026836 A | 4/2002 |
| KR | 2003-0000147 A | 1/2003 |
| KR | 10-2013-0060756 A | 6/2013 |
| KR | 10-2014-0141422 A | 12/2014 |

OTHER PUBLICATIONS

Korean Office Action dated Jan. 9, 2019 in corresponding Korean Patent Application No. 10-2017-0049109 (5 pages in English and 4 pages in Korean).

* cited by examiner

*Primary Examiner* — Robert J Pascal
*Assistant Examiner* — Kimberly E Glenn
(74) *Attorney, Agent, or Firm* — NSIP Law

(57) ABSTRACT

A radio frequency transmitter includes a transmit circuit configured to generate a transmit signal; a receive band rejection filter comprising a capacitor and an inductor resonating with each other to reject a receive frequency band from the transmit signal, wherein a ratio value of a capacitance value of the capacitor to an inductance value of the inductor is within a predetermined range; and a power amplifying circuit configured to amplify the transmit signal through the receive band rejection filter.

17 Claims, 11 Drawing Sheets

L, C value for resonance frequency

TX band attenuation by LC filter

Inductor value for resonance frequency

RADIO FREQUENCY TRANSMITTER HAVING IMPROVED RECEIVE BAND REJECTION FUNCTION

CROSS-REFERENCE TO RELATED APPLICATION(S)

This application claims benefit of priority to Korean Patent Application Nos. 10-2016-0109333 filed on Aug. 26, 2016 and 10-2017-0049109 filed on Apr. 17, 2017 in the Korean Intellectual Property Office, the disclosure of which is incorporated herein by reference for all purposes.

BACKGROUND

1. Field

The present disclosure relates to a radio frequency transmitter, the DC-DC converter comprising a boost-up converter configured to generate a voltage to drive the LED array for the backlight of a frequency division duplexing (FDD) communications apparatus.

2. Description of Related Art

In general, a communications apparatus for long term evolution (LTE), wideband code division multiple access (WCDMA), or global system for mobile communications (GSM) or the like, may use a frequency division duplexing (FDD) or time division duplexing (TDD) method in order to perform both uplink and downlink functions. The FDD method is a method of simultaneously performing uplink and downlink communications by isolating a receiving frequency and a transmission frequency from each other by allocating different frequencies to the uplink and downlink communication. TDD method is a method where uplink and downlink are separated from each other by allocating different time slots in the same frequency band.

In the FDD method, the transmission frequency and the receiving frequency are isolated from each other in order to significantly reduce interference therebetween. However, a receive path is very sensitive, such that a transmit signal having a large amount of power may be introduced into a receive band which would negatively influence the receiver sensitivity as receive (Rx) band noise. Since the receive band noise has a direct influence on the receiver sensitivity, managing the receive band noise is an important performance index in signal transmission.

In addition, in an FDD communications apparatus, a transmit band and a receive band are isolated from each other using a duplexer, but there's a limit to the isolation provided. There is a trade-off between isolation and transmit insertion loss and harmonic characteristics. For example, isolation deteriorates when transmit insertion loss improves in the duplexer, and transmit insertion loss deteriorates when isolation improves.

Therefore, the inverse relationship between transmission loss and insertion loss makes it is difficult to satisfy isolation requirements at a required level or more while maintaining transmit insertion loss requirements at the required level or more using an existing duplexer.

Transmit insertion loss characteristics in the FDD communications apparatus are relevant to comparative long-range communications and efficiency, and have thus been seen as being important.

In a conventional FDD communications apparatus, as a method of reducing receive band noise, a filter such as an RC low pass filter, an LC low pass filter, an LC trap, or the like, has been used in order to block power supply noise introduced from an operating power supply VCC.

However, the conventional method of rejecting power supply noise as described above does not efficiently reject receive band noise. In addition, meeting the receive band noise rejection requirement in the duplexer may inadvertently deteriorate the transmit insertion loss of the duplexer. Therefore, a method of improving isolation characteristics while maintaining transmit insertion loss characteristics at a required level or more is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency transmitter includes a transmit circuit configured to generate a transmit signal; a receive band rejection filter receiving the transmit signal and configured to reject a receive frequency band from the transmit signal, the receive band rejection filter comprising a capacitor and an inductor resonating with each other to reject the receive frequency band, and a ratio value of a capacitance value of the capacitor to an inductance value of the inductor is within a predetermined range; and a power amplifying circuit configured to amplify the transmit signal through the receive band rejection filter.

The capacitor and the inductor may resonate in series with each other, and in a series resonance circuit in which a capacitance value of the capacitor is C picofarads (pF) and an inductance value of the inductor is C*M1 nanohenry (nH), M1, corresponding to a first ratio value, may be within a range of 1 to 20.

The capacitor and the inductor may resonate in parallel with each other, and in a parallel resonance circuit in which an inductance value of the inductor is L nanohenry (nH) and a capacitance value of the capacitor is L*M2 picofarads (pF), M2, corresponding to a second ratio value, may be within a range of 1 to 20.

The inductor may include at least one inductance element.
The inductor may include a bonding wire.

In another general aspect, a radio frequency transmitter includes a transmit circuit configured to generate a transmit signal; a receive band rejection filter receiving the transmit signal and configured to reject a receive frequency band from the transmit signal; and a power amplifying circuit configured to amplify the transmit signal through the receive band rejection filter. Either of the transmit circuit or the power amplifying circuit includes a capacitor for impedance matching. The receive band rejection filter comprises an inductor that resonates with the capacitor to reject the receive band, and a ratio value between a capacitance value of the capacitor and an inductance value of the inductor is within a predetermined range.

The receive band rejection filter may include a capacitor and an inductor resonating with each other in series to reject the receive band, and in a series resonance circuit in which a capacitance value of the capacitor is C pF and an inductance value of the inductor is C*M1 nH, M1, corresponding to a first ratio value, may be within a range of 1 to 20.

The receive band rejection filter may include a capacitor and an inductor resonating with each other in parallel to reject the receive band, and in a parallel resonance circuit in which an inductance value of the inductor is L nH and a capacitance value of the capacitor is L*M2 pF, M2, corresponding to a second ratio value, may be within a range of 1 to 20.

The inductor may include at least one inductance element.

The inductor may include a bonding wire.

The predetermined range may be 1 to 20.

In another general aspect, a radio frequency transmitter includes a transmit circuit configured to generate a transmit signal; a receive band rejection filter receiving the transmit signal and configured to filter a receive frequency band from the transmit signal to create a filtered transmit signal, the receive band rejection filter comprising a capacitor and an inductor resonating with each other, and a ratio value of a capacitance value of the capacitor to an inductance value of the inductor is within 1 to 20; and a power amplifying circuit configured to amplify the filtered transmit signal.

The capacitor and the inductor may resonate in series with each other.

The capacitor and the inductor may resonate in parallel with each other.

The inductor may be a bonding wire.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
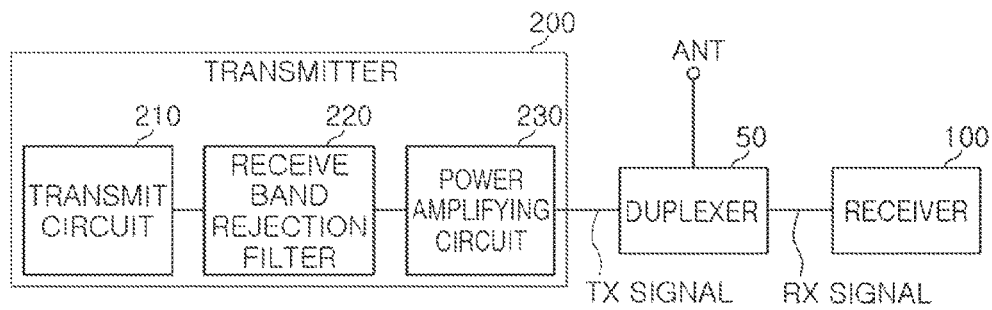
FIG. 1 is a block diagram illustrating an example of a communications apparatus.

FIG. 1 is a block diagram illustrating an example of a communications apparatus.

Referring to FIG. 1, the communications apparatus includes a duplexer 50 connected to an antenna ANT to isolate a transmit signal and a receive signal, a receiver 100 for receiving the receive signal, and a radio frequency (RF) transmitter 200 for providing the transmit signal.

The radio frequency transmitter 200 includes a transmit circuit 210, a receive band rejection filter 220, and a power amplifying circuit 230.

The transmit circuit 210, a circuit generating the transmit signal on the basis of transmit data, may include a modulator, a digital to analog (D/A) converter, a mixer, an amplifier, and the like.

The receive band rejection filter 220 is disposed between the transmit circuit 210 and the power amplifying circuit 230, and rejects a receive band (a frequency band of an RX signal) from the transmit signal input to the power amplifying circuit 230.

In an example, the receive band rejection filter 220 includes a capacitor and an inductor resonating with each other to reject or filter out the receive band, and a ratio value between a capacitance value of the capacitor and an inductance value of the inductor is within a predetermined range.

The power amplifying circuit 230 amplifies the transmit signal through the receive band rejection filter 220. In an example, the power amplifying circuit 230 is implemented by an integrated circuit (IC), and includes a power amplifier (PA).

In an example, in a case in which the power amplifying circuit 230 includes the power amplifier PA, when the receive band rejection filter 220 is included in an input path of the power amplifier PA, a position of the receive band rejection filter 220 is not particularly limited. Here, the input path of the power amplifier PA corresponds to a signal path between the power amplifier PA and the transmit circuit 210.

The communications apparatus may be a frequency division duplexing (FDD) communications apparatus, and the transmit band and the receive band may have different center frequencies.

Figure 2:
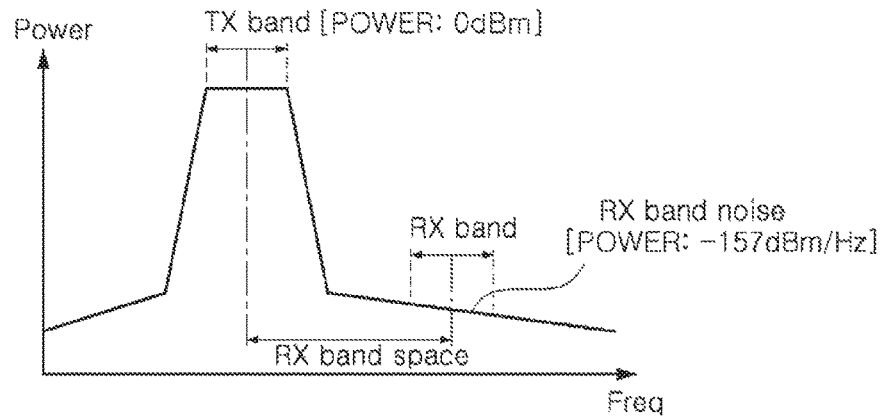
FIG. 2 is a graph illustrating an example of a transmission spectrum of the communications apparatus.

FIG. 2 is a graph illustrating a transmission spectrum of a communications apparatus. Referring to FIG. 2, the transmit band and the receive band of the FDD communications apparatus are spaced apart from each other by a receive band space.

An RF signal generated in the radio frequency transmitter may generally have receive band noise of −157 dBm/Hz, and such a receive band noise is coupled into an input terminal of the power amplifying circuit 230, which would be amplified by the power amplifying circuit. The present disclosure suggests a solution for such a receive band noise.

The receive band rejection filter 220 is disposed between the transmit circuit 210 and the power amplifying circuit 230, and includes an LC resonance filter to reject or filter out the receive band (the frequency band of the RX signal) originating from the power amplifying circuit 230.

In addition, a filter having excellent selectivity or quality (Q) factor to pass the transmit band therethrough and reject or filter out the receive band, such as a surface acoustic wave (SAW) filter or a bulk acoustic wave (BAW) filter, may be used as the receive band rejection filter 220.

A power amplifying apparatus in the present disclosure includes the receive band rejection filter 220 and the power amplifying circuit 230. The power amplifying circuit 230 may include the power amplifier PA.

As an example, cases in which the receive band rejection filter 220 is formed of an LC resonance filter will be described with reference to FIGS. 3 and 4.

Figure 3:
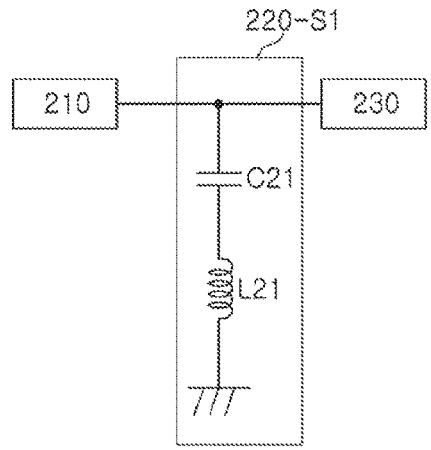
FIG. 3 is a view illustrating an example of a receive band rejection filter.
Figure 4:
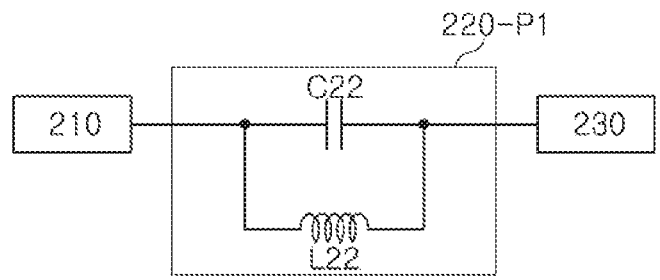
FIG. 4 is a view illustrating another example of a receive band rejection filter.

FIG. 3 is a view illustrating an example of a receive band rejection filter, and FIG. 4 is a view illustrating another example of a receive band rejection filter.

Referring to FIG. 3, a receive band rejection filter 220-S1 includes a series LC resonance filter including a capacitor C21 and an inductor L21 connected in series between a signal line and a ground. Here, the series LC resonance filter forms series resonance in a receive band, such that the impedance becomes substantially zero in the receive band. Therefore, the receive band is bypassed to the ground by a receive band rejection filter 220R, such that an input of the receive band to the power amplifying circuit is suppressed.

The receive band rejection filter 220-S1 includes the capacitor C21 and the inductor L21, resonating with each other in series, to reject or filter out the receive band.

As an example, a ratio value between a capacitance value of the capacitor C21 and an inductance value of the inductor L21 is within a predetermined range.

For example, in a series resonance circuit in which the capacitance value of the capacitor C21 is C F and the inductance value of the inductor L21 is C*MS H, MS, the ratio value, is within a range of $1*10^3$ to $20*10^3$.

In addition, when the capacitance value of the capacitor C21 is measured in picofarad (pF) and the inductance value of the inductor L21 is measured in nanohenry (nH), in a series resonance circuit in which the capacitance value of the capacitor C21 is C pF and the inductance value of the inductor L21 is C*M1 nH, M1, the first ratio value will be between 0 and 20. Alternatively, the first ratio value M1 may be within a range of 1 and 20. Such a description may be applied to the series resonance circuit according to each exemplary embodiment in the present disclosure.

In addition, the inductor L21 may include at least one inductance element. Alternatively, the inductor L21 may include a bonding wire.

Referring to FIG. 4, a receive band rejection filter 220-P1 includes a parallel LC resonance filter including a capacitor C22 inserted into a signal line and an inductor L22 are connected in parallel. Here, the parallel LC resonance filter forms parallel resonance in the receive band, such that impedance substantially becomes infinite in the receive band. Therefore, an input of the receive band to the power amplifying circuit is blocked by the receive band rejection filter 220.

The receive band rejection filter 220-P1 includes the capacitor C22 and the inductor L22 resonating in parallel with each other to reject or filter out the receive band.

In an example, the ratio value between a capacitance value of the capacitor C22 and an inductance value of the inductor L22 is within a predetermined range.

For example, in a parallel resonance circuit in which the inductance value of the inductor L22 is L H and the capacitance value of the capacitor C22 is L*MP F, MP, the ratio value, is within a range of $1*10^3$ to $20*10^3$. Such a content is applied to a parallel resonance circuit according to each exemplary embodiment in the present disclosure.

In addition, when the capacitance value of the capacitor C22 is measured in picofarad (pF) and the inductance value of the inductor L22 is measured in a nanohenry (nH), in a parallel resonance circuit in which the inductance value of the inductor L22 is L nH and the capacitance value of the capacitor C22 is L*M2 pF, M2, the second ratio value, is within a range of 1 to 20.

As an example, the inductor L22 may include at least one inductance element. Alternatively, the inductor L22 may include a bonding wire.

Examples in which the receive band rejection filters 220-S1 and 220-P1 are implemented by the LC resonance filter are described in each exemplary embodiment in the present disclosure illustrated in FIGS. 3 and 4, but the receive band rejection filters 220-S1 and 220-P1 may also be formed of a combination of at least one inductor and at least one capacitor.

In addition, the receive band rejection filters 220-S1 and 220-P1 are formed of a variable filter. As an example, the receive band rejection filters 220-S1 and 220-P1 are configured so that at least one of the inductor and the capacitor thereof varies. In this case, a variable filter element or a switch type variable circuit is used as the variable filter, and a method of implementing the variable filter is not particularly limited.

As an example, either the transmit circuit 210 or the power amplifying circuit 230 includes a matching circuit including a capacitor for impedance matching. In this case, the receive band rejection filter includes the capacitor of the matching circuit and an inductor to reject or filter out the receive band, and a ratio value between a capacitance value of the capacitor and an inductance value of the inductor is within a predetermined range. This will be described with reference to FIGS. 5 through 8.

Figure 5:
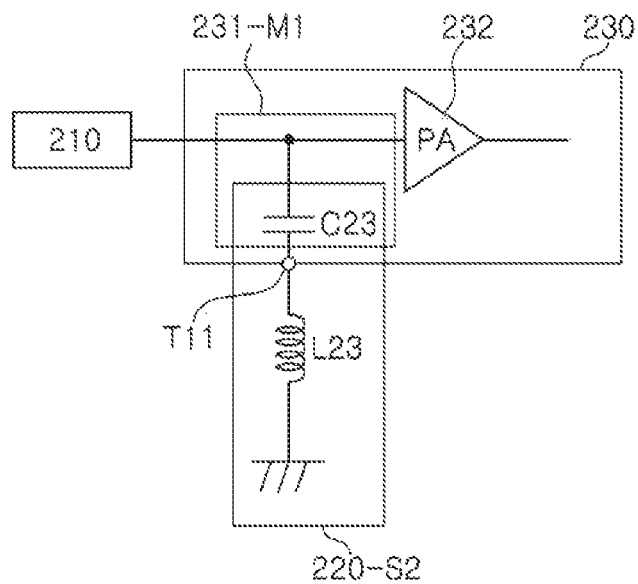
FIG. 5 is a view illustrating another example of a receive band rejection filter.
Figure 6:
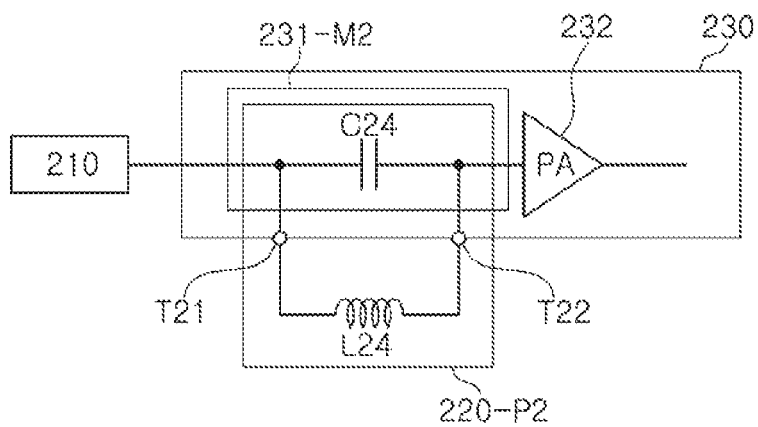
FIG. 6 is a view illustrating another example of a receive band rejection filter.

FIG. 5 is a view illustrating another example of a receive band rejection filter, and FIG. 6 is a view illustrating another example of a receive band rejection filter.

Referring to FIG. 5, as an example, the power amplifying circuit includes a matching circuit 231-M1 and a power amplifier 232, and the matching circuit 231-M1 includes a capacitor C23 for input matching of the power amplifier 232. The capacitor C23 of the matching circuit 231-M1 is connected between a signal line and an external terminal T11. In an example, the power amplifying circuit is formed of an integrated circuit including the matching circuit 231-M1 and the power amplifier 232.

In this case, a receive band rejection filter 220-S2 includes the capacitor C23 of the matching circuit 231-M1 and an inductor L23 connected in series between the external terminal T11 and a ground to resonate with the capacitor C23. The capacitor C23 and the inductor L23 constitute a series LC resonance filter.

The receive band rejection filter 220-S2 includes the capacitor C23 and the inductor L23 resonating with each other in series to reject or filter out the receive band.

As an example, a ratio value between a capacitance value of the capacitor C23 and an inductance value of the inductor L23 is within a predetermined range. In addition, the inductor L23 includes at least one inductance element. Alternatively, the inductor L23 may include a bonding wire.

Referring to FIG. 6, as an example, the power amplifying circuit includes a matching circuit 231-M2 and a power amplifier 232. The matching circuit 231-M2 includes a capacitor C24 for input matching of the power amplifier 232. The capacitor C24 of the matching circuit 231-M2 is inserted into a signal line. In an example, the power amplifying circuit is formed of an integrated circuit including the matching circuit 231-M2 and the power amplifier 232.

In this case, a receive band rejection filter 220-P2 includes the capacitor C24 of the matching circuit 231-M2 and an inductor L24 connected to the capacitor C24 in parallel through external terminals T21 and T22 to resonate with the capacitor C24 in parallel. The capacitor C24 and the inductor L24 constitute a parallel LC resonance filter.

The receive band rejection filter 220-P2 includes the capacitor C24 and the inductor L24 resonating with each other in parallel to reject or filter out the receive band.

As an example, a ratio value between a capacitance value of the capacitor C24 and an inductance value of the inductor L24 is within a predetermined range.

In addition, the inductor L24 may include at least one inductance element. Alternatively, the inductor L24 may include a bonding wire.

Figure 7:
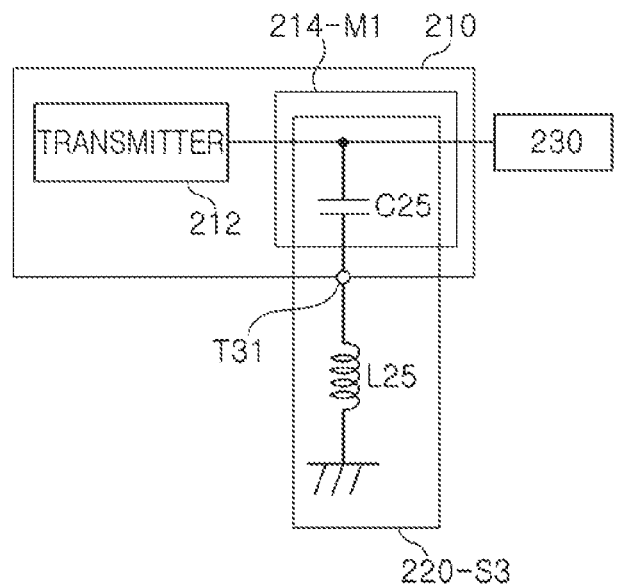
FIG. 7 is a view illustrating another example of a receive band rejection filter.
Figure 8:
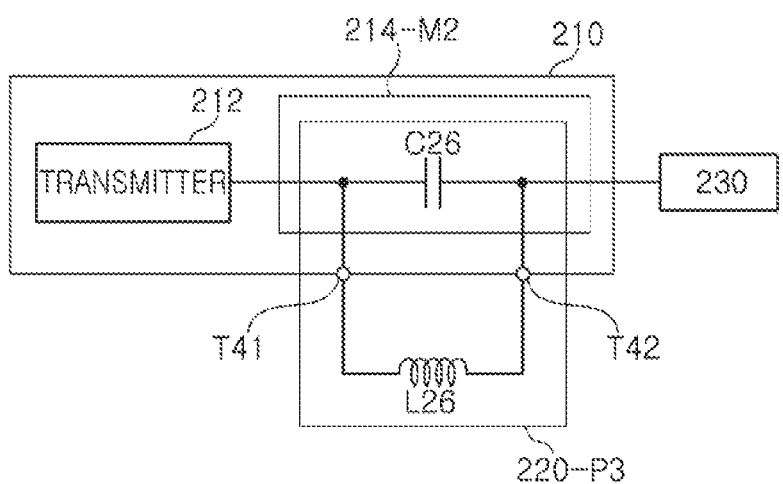
FIG. 8 is a view illustrating another example of a receive band rejection filter.

FIGS. 7 and 8 are views illustrating other examples of a receive band rejection filter.

Referring to FIG. 7, as an example, the transmit circuit includes a transmitter 212 and a matching circuit 214-M1, and the matching circuit 214-M1 includes a capacitor C25 for output matching of the transmitter 212. The capacitor C25 of the matching circuit 214-M1 is connected between a signal line and an external terminal T31. In an example, the transmit circuit is formed of an integrated circuit including the transmitter 212 and the matching circuit 214-M1.

In this case, a receive band rejection filter 220-S3 includes the capacitor C25 of the matching circuit 214-M1 and an inductor L25 connected in series between the external terminal 131 and a ground to resonate with the capacitor C25. The capacitor C25 and the inductor L25 constitute a series LC resonance filter.

The receive band rejection filter 220-S3 includes the capacitor C25 and the inductor L25 resonating with each other in series to reject or filter out the receive band.

As an example, a ratio value between a capacitance value of the capacitor C25 and an inductance value of the inductor L25 is within a predetermined range.

In addition, the inductor L25 may include at least one inductance element. Alternatively, the inductor L25 may include a bonding wire.

Referring to FIG. 8, as an example, the transmit circuit includes a transmitter 212 and a matching circuit 214-M2, and the matching circuit 214-M2 includes a capacitor C26 for output matching of the transmitter 212. The capacitor C26 of the matching circuit 214-M2 is inserted into a signal line. In an example, the transmit circuit is formed of an integrated circuit including the transmitter 212 and the matching circuit 141-M2.

In this case, a receive band rejection filter 220-P3 includes the capacitor C26 of the matching circuit 214-M2 and an inductor L26 connected in parallel to the capacitor C26 through external terminals T41 and T42 to resonate with the capacitor C26. The capacitor C26 and the inductor L26 constitute a parallel LC resonance filter.

The receive band rejection filter 220-P3 includes the capacitor C26 and the inductor L26 resonating with each other in parallel to reject or filter out the receive band.

As an example, a ratio value between a capacitance value of the capacitor C26 and an inductance value of the inductor L26 is within a predetermined range.

In addition, the inductor L26 may include at least one inductance element. Alternatively, the inductor L26 may include a bonding wire.

As described above, when the capacitor of the receive band rejection filter 220-S1, 220-S2, 220-S3, 220-P1, 220-P2, or 220-P3 is implemented in the integrated circuit (a power amplifying IC or a transmit IC), the receive band rejection filter 220-S1, 220-S2, 220-S3, 220-P1, 220-P2, or 220-P3 may not need to have a capacitor externally added for the resonance filter, such that the receive band rejection filter 220-S1, 220-S2, 220-S3, 220-P1, 220-P2, or 220-P3 is further miniaturized.

One of the core technologies of the present disclosure is to significantly reduce transmit insertion loss and suppress receive band noise as much as possible. One of the ways the transmit insertion loss is reduced and the receive band noise is suppressed is by disposing a sharp receive band rejection filter having a resonance filter formed in an input path of a power amplifier and tuning a resonance frequency to a center frequency of a receive band. The receive band rejection filter is implemented by an LC filter in order to perform such a function, which will be described with reference to FIGS. 9 and 10.

Figure 9:
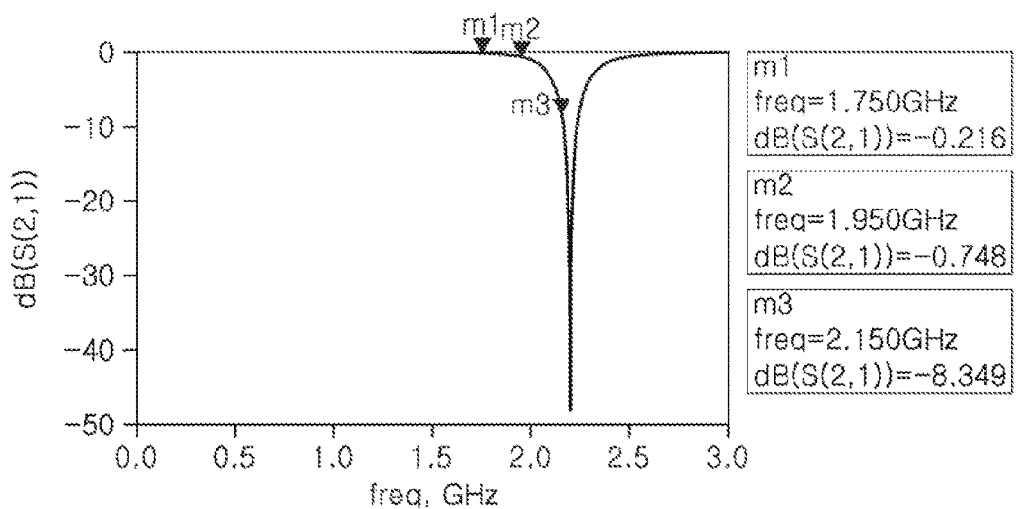
FIG. 9 is a graph illustrating receive band rejection characteristics in a case in which a receive band rejection filter is a series LC filter.
Figure 10:
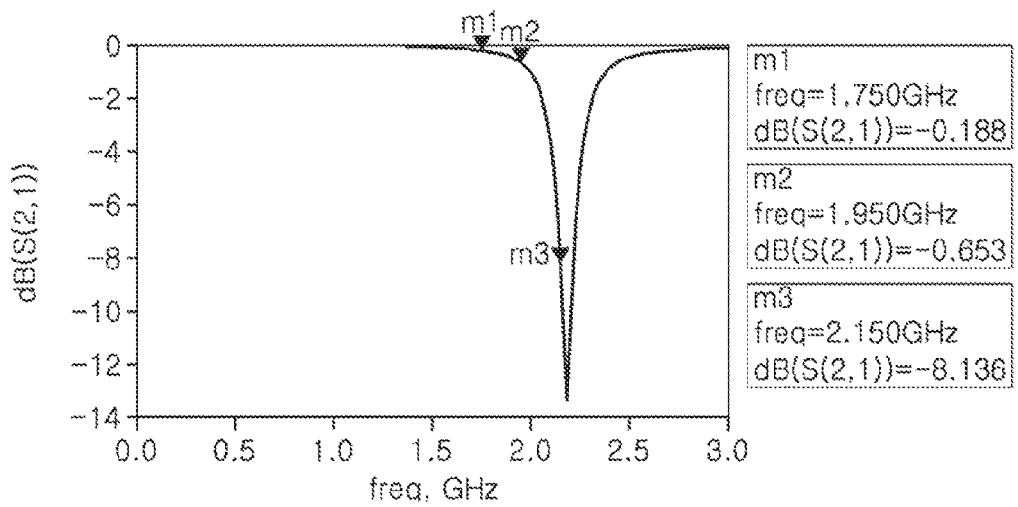
FIG. 10 is a graph illustrating receive band rejection characteristics in a case in which a receive band rejection filter is a parallel LC filter.

FIG. 9 is a graph illustrating receive band rejection characteristics of a receive band rejection filter implemented as a series LC filter, and FIG. 10 is a graph illustrating receive band rejection characteristics of a receive band rejection filter implemented as a parallel LC filter.

Receive band rejection characteristics of the receive band rejection filter implemented as the series LC filter will be described with reference to FIG. 9. As the measured value of m3 of FIG. 9 depicts, in a case in which a transmit band is 1.750 GHz (m1) and a receive band is 2.150 GHz (m3), the level of the receive band is suppressed to about −8.349 [dB].

Receive band rejection characteristics of the receive band rejection filter implemented as the parallel LC filter will be described with reference to FIG. 10. As the measured value of m3 of FIG. 10 depicts, in a case in which a transmit band is 1.750 GHz (m1) and a receive band is 2.150 GHz (m3), the level of the receive band is suppressed to about −8.136 [dB].

Advantages is provided in a case in which the receive band rejection filter is disposed in the input path of the power amplifier as compared to in a case in which the receive band rejection filter is included in an output path of the power amplifier, which will be described with reference to FIGS. 11A and 11B.

Figure 11A:
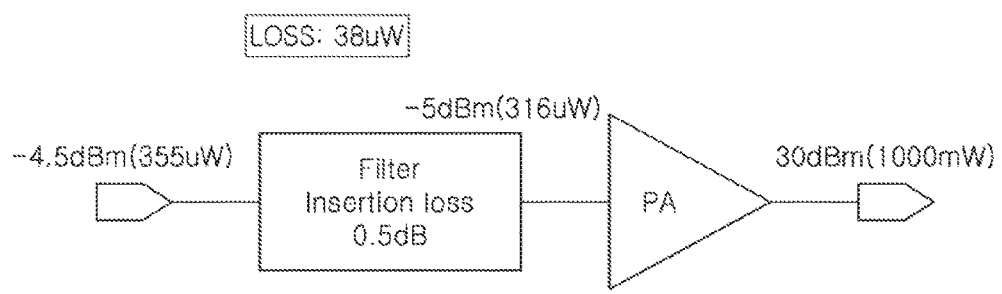
FIG. 11A is a view illustrating power loss in a case in which a receive band rejection filter is disposed adjacently to an input of a power amplifying circuit.
Figure 11B:
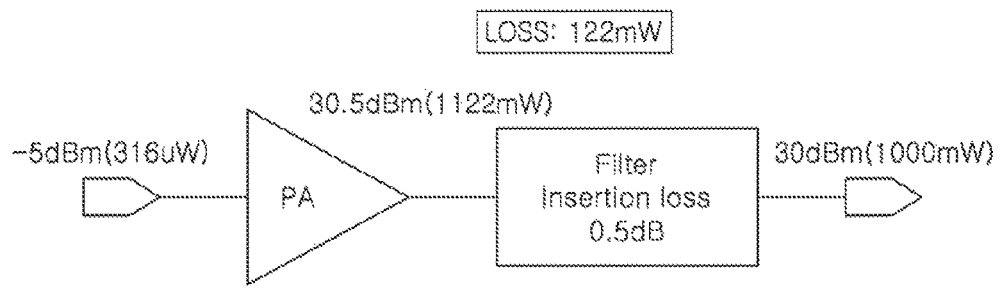
FIG. 11B is a view illustrating power loss in a case in which a receive band rejection filter is disposed adjacently to an output of a power amplifying circuit.

FIG. 11A is a view illustrating power loss in a case in which a receive band rejection filter is disposed adjacently to an input of a power amplifying circuit, and FIG. 11B is a view illustrating power loss in a case in which a receive band rejection filter is disposed adjacently to an output of a power amplifying circuit.

It is appreciated from FIG. 11A that loss in the receive band rejection filter disposed adjacently to an input of the power amplifier is 38 [μW], and in FIG. 11B, the loss in the receive band rejection filter disposed adjacently to an output of the power amplifier is 122 [mW].

That is, in FIGS. 11A and 11B, even though insertion loss in the input path of the power amplifier is relatively high, it is ignorable in terms of loss, and it is more advantageous in terms of efficiency to dispose the receive band rejection filter in the input than in the output since the power loss is reduced.

In addition, it is appreciated that in a case in which a receive band space is a small band, transmit insertion loss becomes great, such that it is difficult to use the receive band rejection filter in the output of the power amplifier.

Further, it is appreciated that even though the loss of the receive band rejection filter in the input path of the power amplifier is great, it is small and is recoverable in terms of entire loss.

Figure 12A:
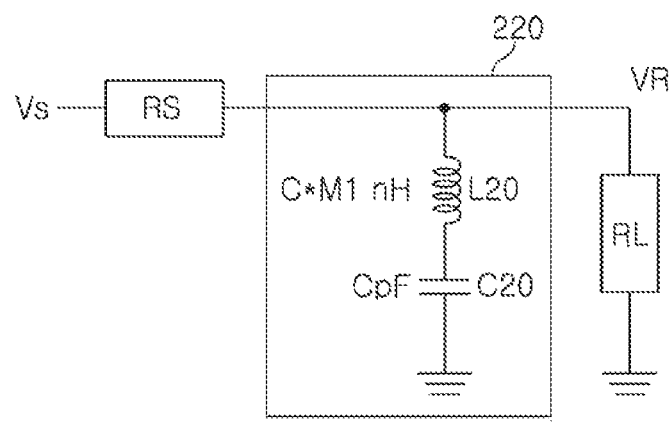
FIG. 12A is a view illustrating an example of a receive band rejection filter.
Figure 12B:
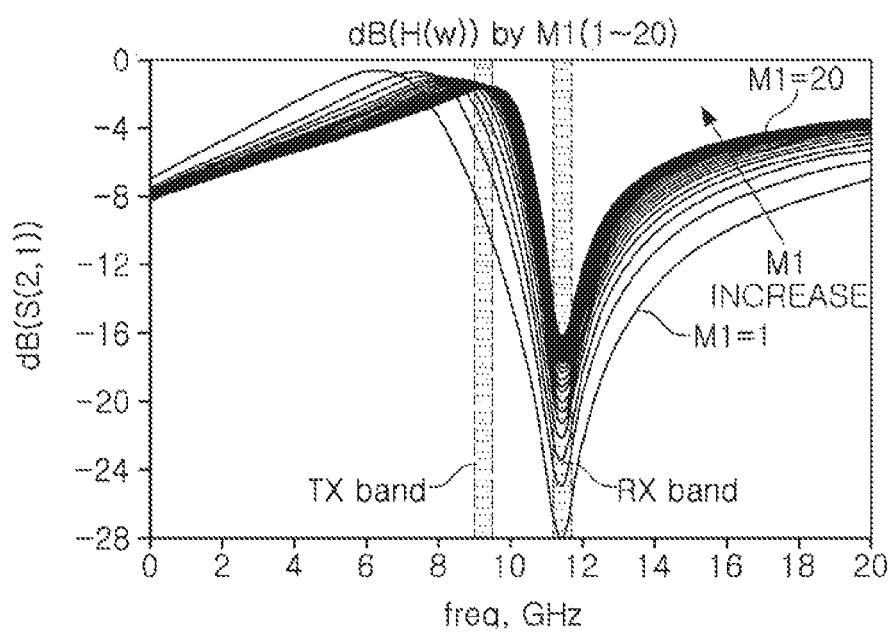
FIG. 12B is graphs illustrating frequency characteristics of the receive band rejection filter illustrated in FIG. 12A.

FIG. 12A is a view illustrating an example of a receive band rejection filter, and FIG. 12B is graphs illustrating frequency characteristics of the receive band rejection filter illustrated in FIG. 12A.

In FIG. 12A, the receive band rejection filter 220 includes an inductor L20 and a capacitor C20 resonating with each other in series to reject or filter out the receive band.

As an example, a ratio value between a capacitance value of the capacitor C20 and an inductance value of the inductor L20 is within a predetermined range.

In an example, in the case in which the capacitance value of the capacitor C20 is measured in picofarad (pF) and the inductance value of the inductor L20 is measured in nanohenry (nH), in a series resonance circuit in which the capacitance value of the capacitor C20 is C pF and the inductance value of the inductor L20 is C*M1 nH, M1 has a value within a range 1 to 20. The measurement result obtained by measuring insertion loss (S(2,1)) while changing the value of M1 from 1 to 20 is illustrated in FIG. 12B.

Referring to FIG. 12B, when M1 is 1, receive band rejection characteristics are relatively good, but signal loss characteristics of the transmit band are relatively deteriorated. When M1 is 20, receive band rejection characteristics are relatively deteriorated, but signal loss characteristics of a transmit band are relatively good.

Figure 13A:
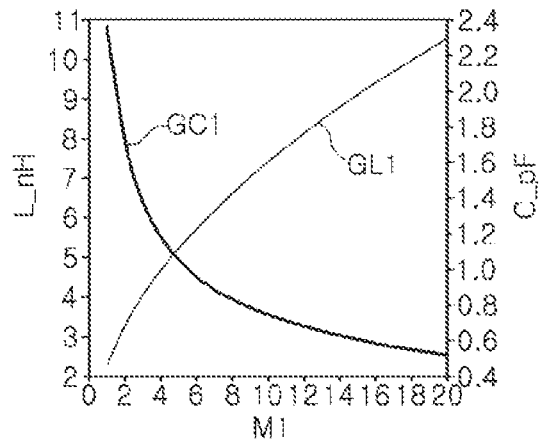
FIGS. 13A through 13C are graphs illustrating a first ratio value M1 between a capacitance value of a capacitor and an inductance value of an inductor in a case in which a receive band rejection filter is a series resonance circuit.
Figure 13B:
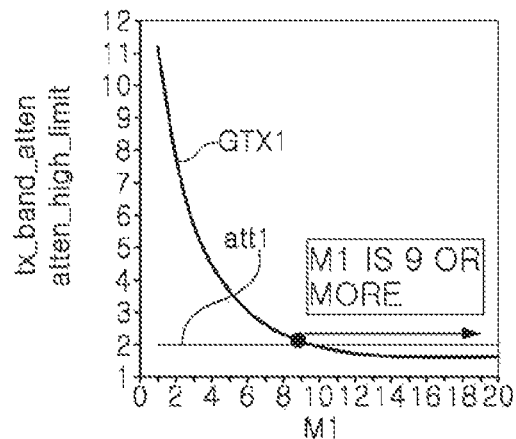
Figure 13C:
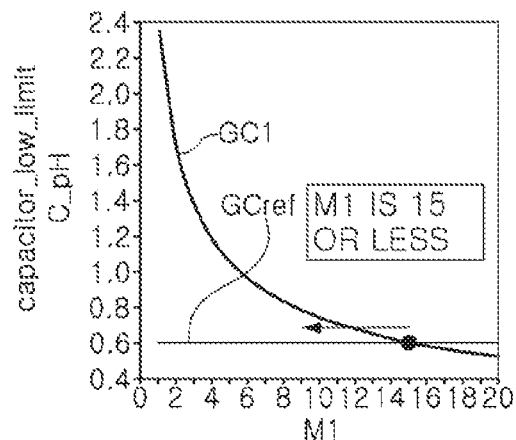

FIGS. 13A through 13C are graphs illustrating a first ratio value M1 between a capacitance value of a capacitor and an inductance value of an inductor in a case in which a receive band rejection filter is implemented as a series resonance circuit.

GL1 of FIG. 13A is a graph illustrating a relationship between the first ratio value M1 and an inductance value L_nH of an inductor, and GC1 of FIG. 13A is a graph illustrating a relationship between the first ratio value M1 and a capacitance value C_pF of a capacitor. As an example, relationships between the capacitor C20 (see FIG. 12A) and the inductor L20 (see FIG. 12A) included in the series resonance circuit and the first ratio value M1 are illustrated in the graphs of FIG. 13A.

GTX1 of FIG. 13B is a graph illustrating a relationship between the first ratio value M1 and transmit attenuation tx_band_atten. Att1 of FIG. 13B is a graph illustrating a relationship between the first ratio value M1 and a transmit attenuation high limit atten_high_limit. Referring to GTX1 and att1 of FIG. 13B, the first ratio value M1 is limited to 9 or more in order for the transmit attenuation to be equal to or less than 2 dB, the transmit attenuation high limit.

GL1 of FIG. 13C is a graph illustrating a relationship between the first ratio value M1 and a capacitance value C_pF of a capacitor, and GLref of FIG. 13C is a graph illustrating a relationship between the first ratio value M1 and a capacitor low limit capacitor_low_limit. Referring to GL1 and GLref of FIG. 13C, the first ratio value M1 is limited to 15 or less in order for the capacitance value to be equal to or greater than 0.6 pF, a reliable capacitance value of the capacitor.

Figure 14:
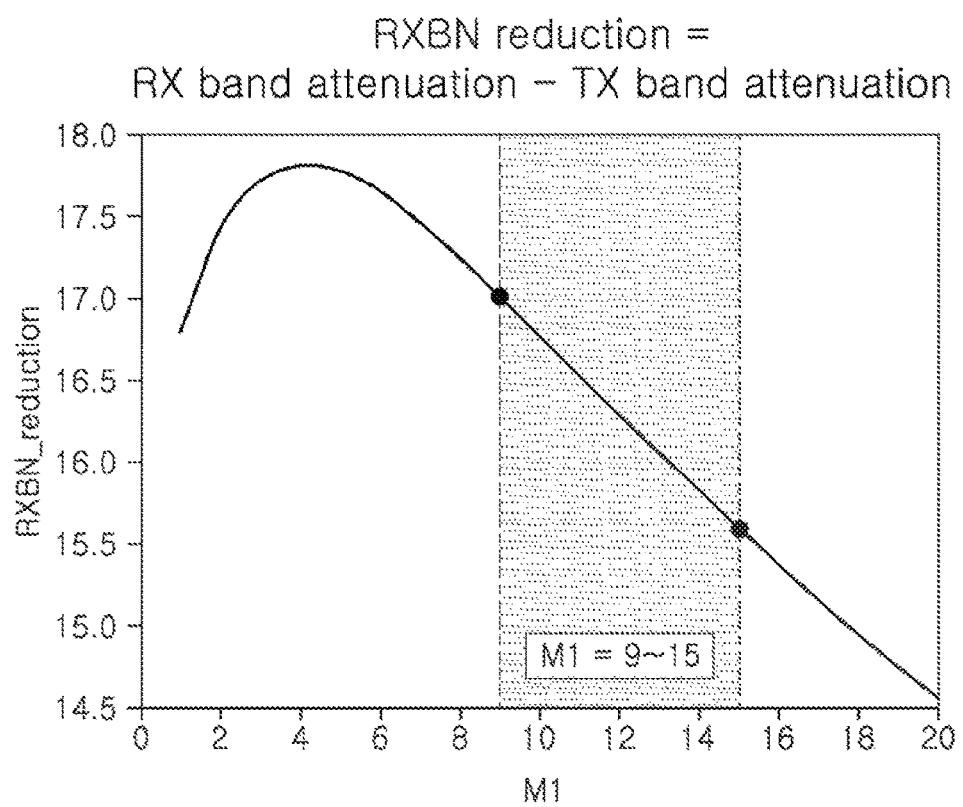
FIG. 14 is a graph illustrating a range of the first ratio value M1 between the capacitance value of the capacitor and the inductance value of the inductor in the case in which the receive band rejection filter is the series resonance circuit.

FIG. 14 is a graph illustrating a range of the first ratio value M1 between the capacitance value of the capacitor and the inductance value of the inductor in the case in which the receive band rejection filter is implemented as the series resonance circuit.

Referring to FIG. 14, in a case in which the receive band rejection filter is a series resonance circuit in which the capacitance value of the capacitor C20 is C pF and the inductance value of the inductor L20 is C*M1 nH, the first ratio value M1 is limited to be in a range of 9 to 15.

Figure 15A:
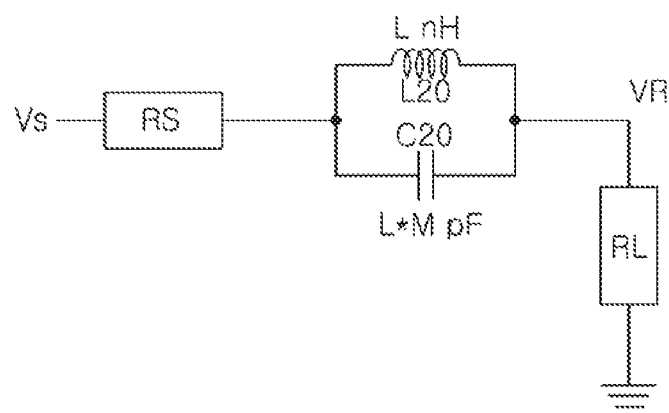
FIG. 15A is a view illustrating another example of a receive band rejection filter.
Figure 15B:
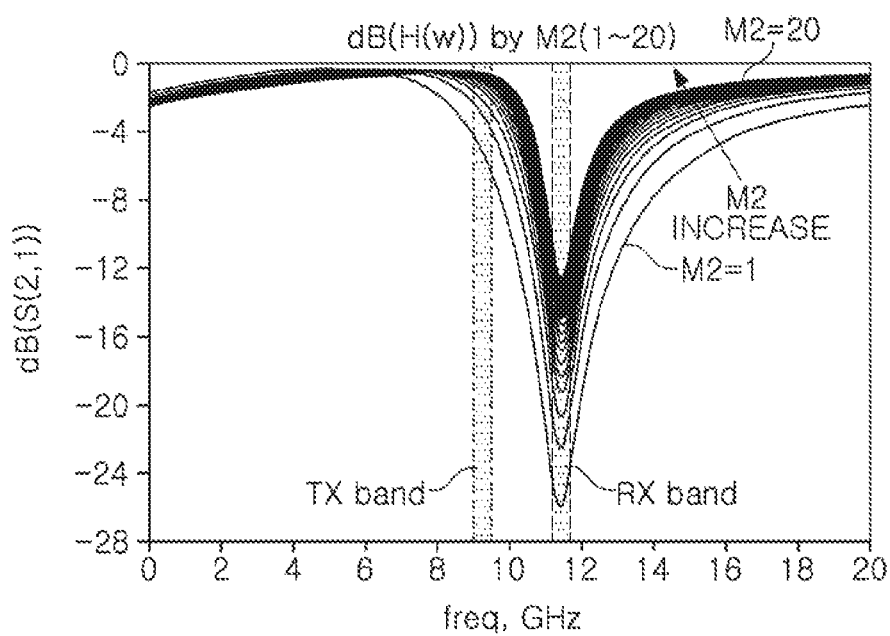
FIG. 15B depicts graphs illustrating frequency characteristics of the receive band rejection filter illustrated in FIG. 15A.

FIG. 15A is a view illustrating another example of a receive band rejection filter, and FIG. 15B is graphs illustrating frequency characteristics of the receive band rejection filter illustrated in FIG. 15A.

In FIG. 15A, the receive band rejection filter 220 includes an inductor L20 and a capacitor C20 resonating with each other in parallel to reject or filter out the receive band. In an example, in a parallel resonance circuit in which the inductance value of the inductor L20 is L nH and the capacitance value of the capacitor C20 is L*M2 pF, M2 has a value between 1 and 20. A measurement result obtained by measuring insertion loss (S(2,1)) while changing the value of M2 from 1 to 20 is illustrated in FIG. 15B.

Referring to FIG. 15B, when M2 is 1, receive band rejection characteristics are relatively good, but signal loss characteristics of a transmit band are relatively deteriorated. And when M2 is 20, receive band rejection characteristics are relatively deteriorated, but signal loss characteristics of a transmit band are relatively good.

Figure 16A:
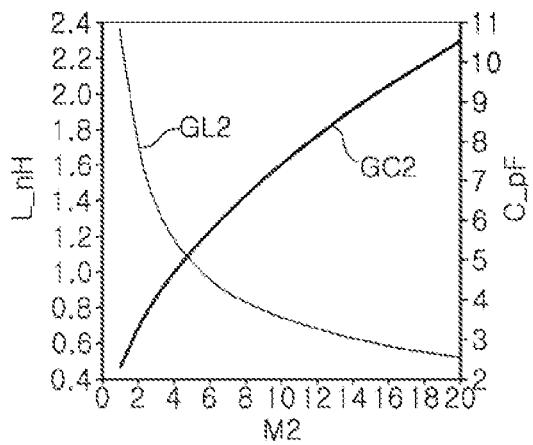
FIGS. 16A through 16C are graphs illustrating a second ratio value M2 between a capacitance value of a capacitor and an inductance value of an inductor in a case in which a receive band rejection filter is a parallel resonance circuit.
Figure 16B:
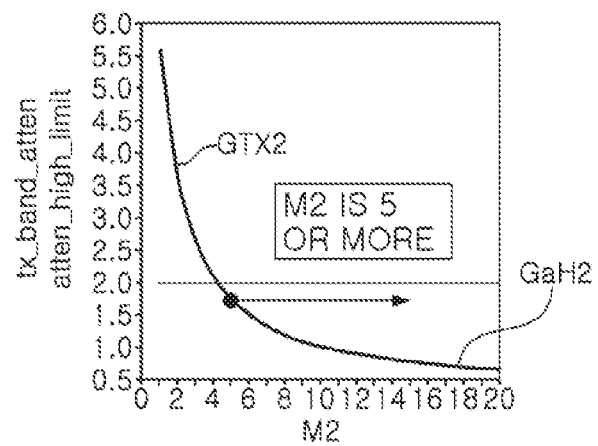
Figure 16C:
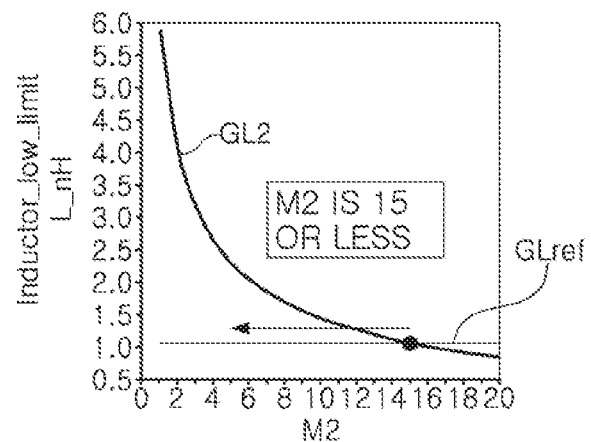

FIGS. 16A through 16C are graphs illustrating a second ratio value M2 between a capacitance value of a capacitor and an inductance value of an inductor in a case in which a receive band rejection filter is a parallel resonance circuit.

GC2 of FIG. 16A is a graph illustrating a relationship between the second ratio value M2 and a capacitance value C_pF of a capacitor. GL2 of FIG. 16A is a graph illustrating a relationship between the second ratio value M2 and an inductance value L_nH of an inductor. As an example, relationships between the inductor L20 and the capacitor C20 included in the parallel resonance circuit and the second ratio value M2 are illustrated in the graphs of FIG. 16A.

GTX2 of FIG. 16B is a graph illustrating a relationship between the second ratio value M2 and transmit attenuation tx_band_atten. Gatt2 of FIG. 16B is a graph illustrating a relationship between the second ratio value M2 and a transmit attenuation high limit atten_high_limit. Referring to GTX2 and Gatt2 of FIG. 16B, the second ratio value M2 is limited to 5 or more in order for the transmit attenuation to be equal to or less than 2 dB, the transmit attenuation high limit.

GL2 of FIG. 16C is a graph illustrating a relationship between the second ratio value M2 and an inductance value L_nH of an inductor, and GLref of FIG. 16C is a graph illustrating a relationship between the second ratio value M2 and an inductor low limit inductor_low_limit.

Referring to GL2 and GLref of FIG. 16C, the second ratio value M2 is limited to 15 or less in order for the inductance value to be equal to or greater than 0.6 nH, a reliable inductance value of the inductor.

Figure 17:
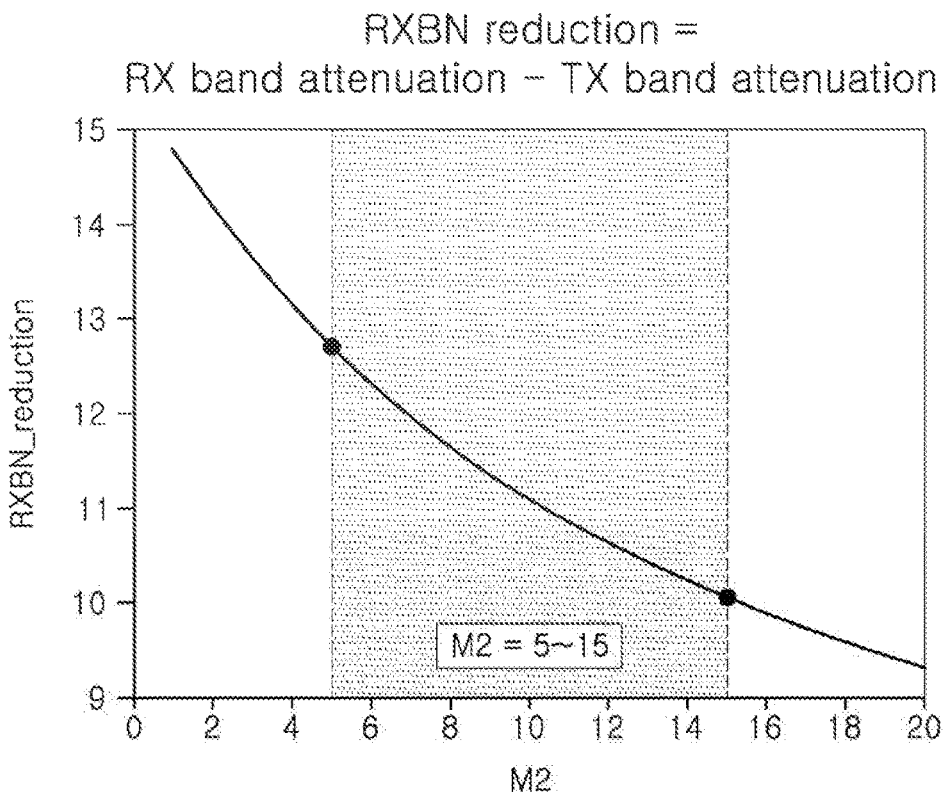
FIG. 17 depicts a graph illustrating a range of the second ratio value M2 between the capacitance value of the capacitor and the inductance value of the inductor in the case in which the receive band rejection filter is the parallel resonance circuit.

FIG. 17 is a graph illustrating a range of the second ratio value M2 between the capacitance value of the capacitor and the inductance value of the inductor in the case in which the receive band rejection filter is the parallel resonance circuit.

Referring to FIG. 17, in a case in which the receive band rejection filter is a parallel resonance circuit in which the inductance value of the inductor L20 is L nH and the capacitance value of the capacitor C20 is L*M2 pF, the second ratio value M2 is limited to be in a range of 5 to 15.

Figure 18:
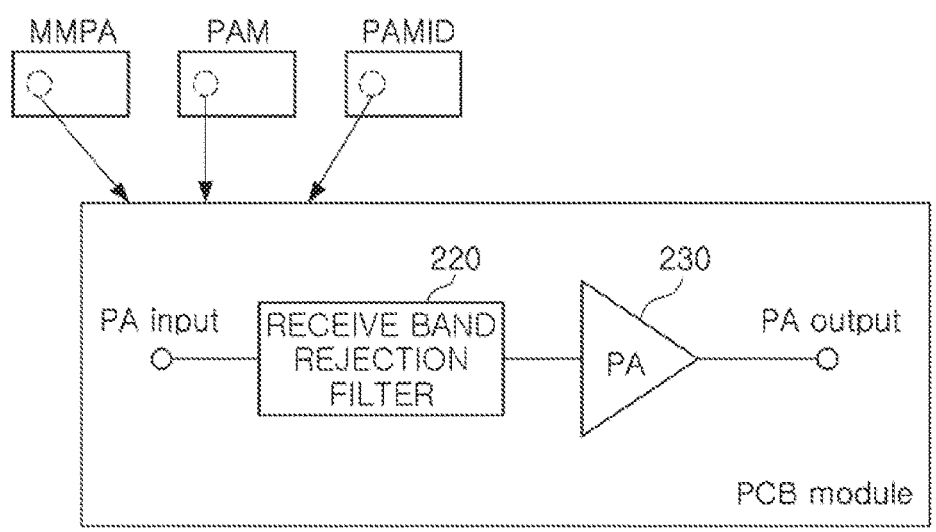
FIG. 18 depicts a block diagram illustrating an example of a power amplifying apparatus including the receive band rejection filter.

FIG. 18 is a block diagram illustrating an example of a power amplifying apparatus including the receive band rejection filter.

Referring to FIG. 18, the power amplifying apparatus including the receive band rejection filter in the present disclosure may be a power amplifier such as a multi-band multi-mode power amplifier (MMPA), a PA module (PAM), a PA integrated duplexer (PAMID), or the like, but is not particularly limited thereto.

In an example, the receive band rejection filter is inserted into the input path of the power amplifier to reject noise while being used as a matching component.

A measurement result obtained by measuring the receive band noise in the output of the power amplifier with respect to the transmit signal having the receive band noise and a measurement result according to the related art in which the receive band rejection filter is not used in the input of the power amplifier are represented by Table 1. In Table 1, in LTE B1, a transmission frequency is 1950 MHz, a receiving frequency is 2140 MHz, and transmit and receive spaces are 190 MHz.

TABLE 1

| B1[dBm/Hz]<br>RX: 2110-2170<br>TX RX space: 190 | RX band noise<br>at PA input<br>[dBm/Hz] | PA Gain<br>[dB] | RX band noise<br>at PA output<br>[dBm/Hz] |
|---|---|---|---|
| Related Art | −157 | 28 | −126 |
| Exemplary Embodiment in the Present Disclosure | −165 | 28 | −140 |

It is appreciated from Table 1 that in a case in which the receive band rejection filter is disposed in the input of the power amplifier as disclosed in the present disclosure, the receive band noise of the transmit signal is reduced.

As set forth above, according to the examples in the present disclosure, receive band noise introduced from the radio frequency transmitter to a radio frequency receiver is efficiently rejected in the radio frequency transmitter, and low power loss is maintained.

In addition, the receive band noise is effectively reduced at a small area and a low complexity to improve sensitivity. When the receive band noise is reduced, a burden of a duplexer for receive isolation is reduced, such that transmit insertion loss of the duplexer is improved and harmonic performance is improved.

Further, a capacitance value of a capacitor of a resonance circuit is set to be greater than an inductance value of an inductor to more efficiently reject the receive band noise.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency transmitter, comprising:
a transmit circuit configured to generate a transmit signal;
a receive band rejection filter comprising a capacitor and an inductor resonating with each other to reject a receive frequency band from the transmit signal, wherein a ratio value of a capacitance value of the capacitor to an inductance value of the inductor is within a predetermined range; and
a power amplifying circuit configured to amplify the transmit signal through the receive band rejection filter.

2. The radio frequency transmitter of claim 1, wherein the capacitor and the inductor resonate in series with each other, and
in a series resonance circuit in which the capacitance value of the capacitor is C picofarads (pF) and the inductance value of the inductor is C*M1 nanohenry (nH), M1, corresponding to a first ratio value, is within a range of 1 to 20.

3. The radio frequency transmitter of claim 2, wherein the inductor comprises an inductance element.

4. The radio frequency transmitter of claim 1, wherein the capacitor and the inductor resonate in parallel with each other, and
in a parallel resonance circuit in which the inductance value of the inductor is L nanohenry (nH) and the capacitance value of the capacitor is L*M2 picofarads (pF), M2, corresponding to a second ratio value, is within a range of 1 to 20.

5. The radio frequency transmitter of claim 4, wherein the inductor comprises a bonding wire.

6. The radio frequency transmitter of claim 1, wherein the predetermined range is 1 to 20.

7. A radio frequency transmitter, comprising:

a transmit circuit configured to generate a transmit signal;

a receive band rejection filter configured to reject a receive frequency band from the transmit signal; and a power amplifying circuit configured to amplify the transmit signal through the receive band rejection filter, wherein one of the transmit circuit and the power amplifying circuit comprises a capacitor for impedance matching, the receive band rejection filter comprises an inductor that resonates with the capacitor to reject the receive band, and a ratio value between a capacitance value of the capacitor and an inductance value of the inductor is within a predetermined range.

8. The radio frequency transmitter of claim 7, wherein the receive band rejection filter comprises the capacitor and the inductor resonating with each other in series to reject the receive band, and in a series resonance circuit in which the capacitance value of the capacitor is C pF and the inductance value of the inductor is C*M1 nH, M1, corresponding to a first ratio value, is within a range of 1 to 20.

9. The radio frequency transmitter of claim 8, wherein the inductor comprises an inductance element.

10. The radio frequency transmitter of claim 7, wherein the receive band rejection filter comprises the capacitor and the inductor resonating with each other in parallel to reject the receive band, and in a parallel resonance circuit in which the inductance value of the inductor is L nH and the capacitance value of the capacitor is L*M2 pF, M2, corresponding to a second ratio value, is within a range of 1 to 20.

11. The radio frequency transmitter of claim 10, wherein the inductor comprises a bonding wire.

12. The radio frequency transmitter of claim 7, wherein the predetermined range is 1 to 20.

13. A radio frequency transmitter, comprising:

a transmit circuit configured to generate a transmit signal;

a receive band rejection filter receiving the transmit signal and configured to filter a receive frequency band from the transmit signal to create a filtered transmit signal, the receive band rejection filter comprising a capacitor and an inductor resonating with each other; and a power amplifying circuit configured to amplify the filtered transmit signal;

wherein a ratio value of a capacitance value of the capacitor to an inductance value of the inductor is within 1 to 20.

14. The radio frequency transmitter of claim 13, wherein the capacitor and the inductor resonate in series with each other.

15. The radio frequency transmitter of claim 14, wherein the inductor is a bonding wire.

16. The radio frequency transmitter of claim 13, wherein the capacitor and the inductor resonate in parallel with each other.

17. The radio frequency transmitter of claim 16, wherein the inductor is a bonding wire.

* * * * *